US012660429B2

(12) United States Patent
Hu

(10) Patent No.: US 12,660,429 B2
(45) Date of Patent: Jun. 16, 2026

(54) BENDABLE DISPLAY PANEL HAVING BENDING AREA AND NON-BENDING AREA AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Junyan Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 674 days.

(21) Appl. No.: 17/262,700

(22) PCT Filed: Oct. 29, 2020

(86) PCT No.: PCT/CN2020/124612
§ 371 (c)(1),
(2) Date: Mar. 13, 2023

(87) PCT Pub. No.: WO2021/258593
PCT Pub. Date: Dec. 3, 2021

(65) Prior Publication Data
US 2023/0209913 A1      Jun. 29, 2023

(30) Foreign Application Priority Data

Jun. 24, 2020    (CN) .......................... 202010589553.0

(51) Int. Cl.
*H10K 59/123*      (2023.01)
*H10K 59/12*      (2023.01)
(Continued)

(52) U.S. Cl.
CPC ....... *H10K 59/123* (2023.02); *H10K 59/1201* (2023.02); *H10K 59/122* (2023.02); *H10K 71/00* (2023.02); *H10K 2102/311* (2023.02)

(58) Field of Classification Search
CPC .... H10K 71/80; H10K 50/844; H10K 59/131; H10K 59/40; H10K 59/871; H10K 71/00;
(Continued)

(56) References Cited

U.S. PATENT DOCUMENTS 9,525,070 B1    12/2016  Lv
10,186,684 B2    1/2019  Chun
(Continued)

FOREIGN PATENT DOCUMENTS

CN          107658333 A      2/2018
CN          108269835 A      7/2018
(Continued)

*Primary Examiner* — Caleb E Henry
(74) *Attorney, Agent, or Firm* — PV IP PC; Christopher S. Ruprecht; Wei Te Chung

(57)          ABSTRACT

A display panel, a manufacturing method thereof, and a display device are provided. The display panel is divided into a bending area and a non-bending area, and includes a thin film transistor layer corresponding to the non-bending area, an organic filling layer corresponding to the bending area, and a pixel electrode. The pixel electrode in the bending area is connected to a source of the thin film transistor layer in the non-bending area through a metal trace, the organic filling layer includes a plurality of second via holes, and an organic photoresist is filled in the plurality of second via holes.

12 Claims, 3 Drawing Sheets

(51) Int. Cl.

| | | |
|---|---|---|
| *H10K 59/122* | (2023.01) | |
| *H10K 71/00* | (2023.01) | |
| *H10K 102/00* | (2023.01) | |

(58) Field of Classification Search

CPC ............. H10K 77/111; H10K 59/1201; H10K 2102/311; H10K 59/123; H10K 59/122; H10K 59/00; H10K 59/12; H10K 59/124; G09F 9/301; H10D 86/40; H10D 86/60

See application file for complete search history.

(56) References Cited

U.S. PATENT DOCUMENTS

| | | | | |
|---|---|---|---|---|
| 10,224,344 B2 * | 3/2019 | Lee | ...................... | H10K 77/111 |
| 10,224,504 B2 * | 3/2019 | Park | ................... | H10K 59/1213 |
| 10,553,817 B2 * | 2/2020 | Wang | .................... | H10K 59/40 |
| 11,641,772 B2 * | 5/2023 | Seo | ...................... | H10K 59/131 |
| | | | | 257/773 |
| 11,726,623 B2 * | 8/2023 | Lee | ...................... | G06F 3/0448 |
| | | | | 345/174 |
| 11,730,023 B2 * | 8/2023 | Kim | ...................... | H10K 59/38 |
| | | | | 257/40 |
| 2011/0175092 A1 * | 7/2011 | Yasuda | .................. | H10K 10/88 |
| | | | | 438/161 |
| 2014/0118221 A1 * | 5/2014 | Park | ........................ | G09G 3/20 |
| | | | | 345/1.3 |
| 2014/0217397 A1 * | 8/2014 | Kwak | .................. | H10D 86/441 |
| | | | | 257/43 |
| 2015/0029683 A1 * | 1/2015 | Kim | .................... | H10K 77/111 |
| | | | | 361/749 |
| 2015/0115253 A1 * | 4/2015 | Ha | ....................... | H10K 50/813 |
| | | | | 438/23 |
| 2016/0111479 A1 * | 4/2016 | Kim | .................... | H10K 77/111 |
| | | | | 257/40 |
| 2016/0126496 A1 * | 5/2016 | Wang | ................. | H10K 59/8731 |
| | | | | 257/40 |
| 2017/0110527 A1 * | 4/2017 | Li | .......................... | H10D 86/60 |
| 2017/0194409 A1 * | 7/2017 | Jeong | ................... | H10K 77/111 |
| 2017/0277288 A1 * | 9/2017 | Choi | ..................... | G06F 3/0412 |
| 2017/0303406 A1 * | 10/2017 | Namkung | ................ | B32B 7/12 |
| 2018/0033821 A1 * | 2/2018 | Kim | .................... | H10D 86/441 |
| 2018/0123060 A1 * | 5/2018 | Jang | ................... | H10K 77/111 |
| 2018/0145094 A1 | 5/2018 | Yan | | |
| 2018/0342707 A1 * | 11/2018 | Lee | ...................... | H10K 77/111 |
| 2019/0035872 A1 * | 1/2019 | Um | ..................... | H10K 59/123 |
| 2019/0140202 A1 * | 5/2019 | Jin | ...................... | H10K 59/131 |
| 2019/0206968 A1 * | 7/2019 | Yang | .................. | H10K 77/111 |
| 2019/0214412 A1 * | 7/2019 | Yuan | ................... | H10D 86/411 |
| 2019/0259967 A1 * | 8/2019 | Yang | ................... | G06F 1/1652 |
| 2019/0380197 A1 * | 12/2019 | Lee | ...................... | H05K 1/028 |
| 2020/0057472 A1 * | 2/2020 | Kang | ................... | G06F 1/1601 |
| 2020/0067000 A1 * | 2/2020 | Li | ....................... | H05K 1/0393 |
| 2020/0119118 A1 * | 4/2020 | Kim | .................... | H10K 59/131 |
| 2020/0135063 A1 * | 4/2020 | Jang | ................... | G06F 1/1652 |
| 2020/0161571 A1 * | 5/2020 | Wu | ..................... | H10K 77/111 |
| 2020/0203455 A1 * | 6/2020 | Xie | ..................... | H10D 86/411 |
| 2021/0126209 A1 * | 4/2021 | Lee | ...................... | H10K 59/40 |
| 2021/0175462 A1 * | 6/2021 | Shin | .................. | H10K 59/8794 |

FOREIGN PATENT DOCUMENTS

| | | |
|---|---|---|
| CN | 109032251 A | 12/2018 |
| CN | 109461742 A | 3/2019 |
| CN | 109671761 A | 4/2019 |
| CN | 109887935 A | 6/2019 |
| CN | 109920800 A | 6/2019 |
| CN | 209401247 U | 9/2019 |
| CN | 110518039 A | 11/2019 |
| CN | 111063721 A | 4/2020 |
| CN | 111768706 A | 10/2020 |

* cited by examiner

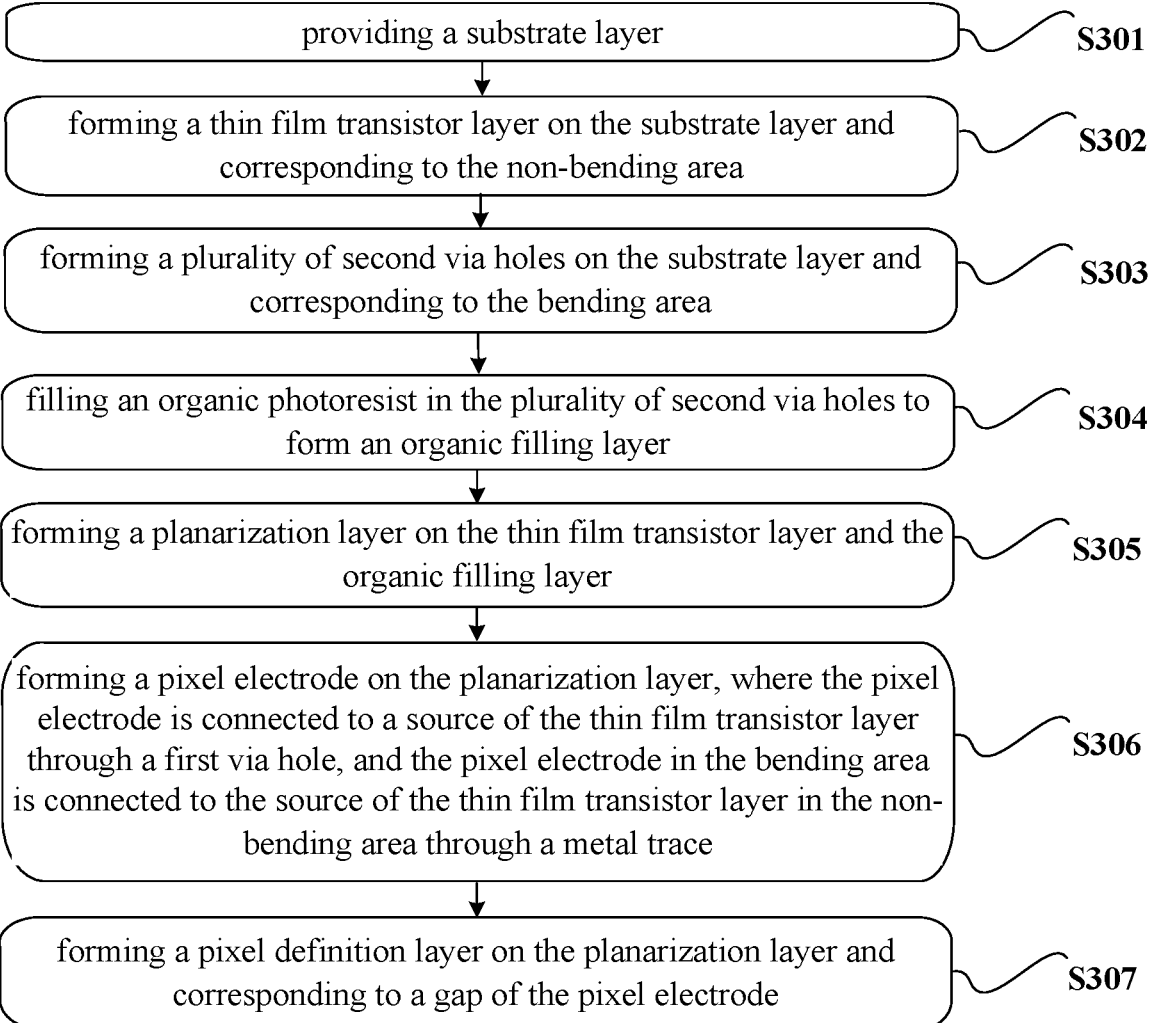

providing a substrate layer ~ S301 forming a thin film transistor layer on the substrate layer and corresponding to the non-bending area ~ S302 forming a plurality of second via holes on the substrate layer and corresponding to the bending area ~ S303 filling an organic photoresist in the plurality of second via holes to form an organic filling layer ~ S304 forming a planarization layer on the thin film transistor layer and the organic filling layer ~ S305 forming a pixel electrode on the planarization layer, where the pixel electrode is connected to a source of the thin film transistor layer through a first via hole, and the pixel electrode in the bending area is connected to the source of the thin film transistor layer in the non-bending area through a metal trace ~ S306 forming a pixel definition layer on the planarization layer and corresponding to a gap of the pixel electrode ~ S307

FIG. 3

BENDABLE DISPLAY PANEL HAVING BENDING AREA AND NON-BENDING AREA AND DISPLAY DEVICE

RELATED APPLICATIONS

This application is a Notional Phase of PCT Patent Application No. PCT/CN2020/124612 having international filing date of Oct. 29, 2020, which claims the benefit of priority of Chinese Patent Application No. 202010589553.0 filed on Jun. 24, 2020. The contents of the above applications are all incorporated by reference as if fully set forth herein in their entirety.

FIELD OF DISCLOSURE

The present disclosure relates to the field of display technologies, and more particularly to a display panel, a manufacturing method thereof, and a display device.

BACKGROUND

When a rigid organic light emitting diode (OLED) display panel becomes a bendable flexible OLED display panel, a biggest challenge is a stress problem. Because an entire display screen is composed of a plurality layers of materials, the materials are squeezed when they are bent, which makes the display screen easy to break and affects display performance.

In the prior art, a bendable OLED display panel adopts a method of etching an inorganic film layer in a bending area and filling an organic photoresist to release a stress during bending. However, this structure has certain limitations, such as an inability to achieve high resolution, a process is complex, and a manufacturing process is difficult. In addition, during bending, an entire thin film transistor will be bent, and there is still a risk of wire breakage. Moreover, electrical properties of the thin film transistor will drift with a bending process, and the display performance cannot be guaranteed. Therefore, it is necessary to improve these defects.

SUMMARY OF DISCLOSURE

Technical Problem

The present disclosure provides a display panel to solve the technical problems of the prior art, such as the bendable display panel cannot achieve high resolution, a process is complicated, a manufacturing process is difficult, and electrical properties of a thin film transistor will drift with a bending process, thereby affecting display performance.

SOLUTION OF PROBLEM

Technical Solution

An embodiment of the present disclosure provides a display panel. The display panel is divided into a bending area and a non-bending area, and includes a substrate layer, a thin film transistor layer, an organic filling layer, a planarization layer, a pixel electrode, and a pixel definition layer. The thin film transistor layer is disposed on the substrate layer and corresponds to the non-bending area. The organic filling layer is disposed on the substrate layer and corresponds to the bending area. The planarization layer is disposed on the thin film transistor layer and the organic filling layer. The pixel electrode is disposed on the planarization layer and is connected to a source of the thin film transistor layer through a first via hole. A pixel definition layer is disposed on the planarization layer and corresponds to a gap of the pixel electrode. The pixel electrode in the bending area is connected to the source of the thin film transistor layer in the non-bending area through a metal trace, the organic filling layer comprises a plurality of second via holes, and an organic photoresist is filled in the plurality of second via holes.

In a display panel of an embodiment of the present disclosure, the second via holes are spaced equally apart from one another.

In a display panel of an embodiment of the present disclosure, distribution densities of the second via holes gradually decrease from a center of the bending area to both sides.

In a display panel of an embodiment of the present disclosure, cross-sectional widths of the second via holes gradually decrease from a center of the bending area to both sides.

In a display panel of an embodiment of the present disclosure, depths of the second via holes range from greater than 0 to less than or equal to 20 microns.

In a display panel of an embodiment of the present disclosure, depths of the second via holes are the same.

In a display panel of an embodiment of the present disclosure, depths of the second via holes gradually decrease from a center of the bending area to both sides.

In a display panel of an embodiment of the present disclosure, shapes of the second via holes are selected from a group consisting of a circle, an ellipse, a sector, and a polygon.

An embodiment of the present disclosure provides a manufacturing method of a display panel. The display panel is divided into a bending area and a non-bending area, and the manufacturing method includes steps of: providing a substrate layer; forming a thin film transistor layer on the substrate layer and corresponding to the non-bending area; forming a plurality of second via holes on the substrate layer and corresponding to the bending area; filling an organic photoresist in the plurality of second via holes to form an organic filling layer; forming a planarization layer on the thin film transistor layer and the organic filling layer; forming a pixel electrode on the planarization layer, where the pixel electrode is connected to a source of the thin film transistor layer through a first via hole, and the pixel electrode in the bending area is connected to the source of the thin film transistor layer in the non-bending area through a metal trace; and forming a pixel definition layer on the planarization layer and corresponding to a gap of the pixel electrode.

In a manufacturing method of a display panel of an embodiment of the present disclosure, the second via holes are spaced equally apart from one another.

In a manufacturing method of a display panel of an embodiment of the present disclosure, distribution densities of the second via holes gradually decrease from a center of the bending area to both sides.

In a manufacturing method of a display panel of an embodiment of the present disclosure, cross-sectional widths of the second via holes gradually decrease from a center of the bending area to both sides.

In a manufacturing method of a display panel of an embodiment of the present disclosure, depths of the second via holes are the same.

In a manufacturing method of a display panel of an embodiment of the present disclosure, depths of the second via holes gradually decrease from a center of the bending area to both sides.

An embodiment of the present disclosure provides a display device, including a driver chip and a display panel. The display panel is divided into a bending area and a non-bending area, and includes a substrate layer, a thin film transistor layer, an organic filling layer, a planarization layer, a pixel electrode, and a pixel definition layer. The thin film transistor layer is disposed on the substrate layer and corresponds to the non-bending area. The organic filling layer is disposed on the substrate layer and corresponds to the bending area. The planarization layer is disposed on the thin film transistor layer and the organic filling layer. The pixel electrode is disposed on the planarization layer and is connected to a source of the thin film transistor layer through a first via hole. The pixel definition layer is disposed on the planarization layer and corresponds to a gap of the pixel electrode. The pixel electrode in the bending area is connected to the source of the thin film transistor layer in the non-bending area through a metal trace, the organic filling layer comprises a plurality of second via holes, and an organic photoresist is filled in the plurality of second via holes.

In a display device of an embodiment of the present disclosure, the second via holes are spaced equally apart from one another.

In a display device of an embodiment of the present disclosure, distribution densities of the second via holes gradually decrease from a center of the bending area to both sides.

In a display device of an embodiment of the present disclosure, cross-sectional widths of the second via holes gradually decrease from a center of the bending area to both sides.

In a display device of an embodiment of the present disclosure, depths of the second via holes are the same.

In a display device of an embodiment of the present disclosure, depths of the second via holes gradually decrease from a center of the bending area to both sides.

ADVANTAGEOUS EFFECT OF INVENTION

Advantageous Effect

In the display panel of the present disclosure, by disposing a thin film transistor in the non-bending area, the pixel electrode in the bending area is connected to the thin film transistor in the non-bending area through the metal trace. This can prevent a scan line from breaking due to a bending process, and the electrical properties of the thin film transistor will not be greatly shifted during bending. Moreover, the plurality of via holes are disposed under the metal trace in the bending area and filled with the organic photoresist, which can reduce a risk of the metal trace breaking and greatly relieve the stress on each the film layer when it is bent.

BRIEF DESCRIPTION OF DRAWINGS

FIG. 3 is a flowchart of a manufacturing method of a display panel of an embodiment of the present disclosure.

EMBODIMENT OF INVENTION

DETAILED DESCRIPTION

In order to make the purpose, technical solution, and the advantages of the present disclosure clearer and specific, further detailed descriptions of the present disclosure are stated here, referencing to the accompanying drawings and some preferred embodiments of the present disclosure. It should be understood that the detailed embodiments of the disclosure described here are used to explain the present disclosure only, instead of limiting the present disclosure.

Figure 1:
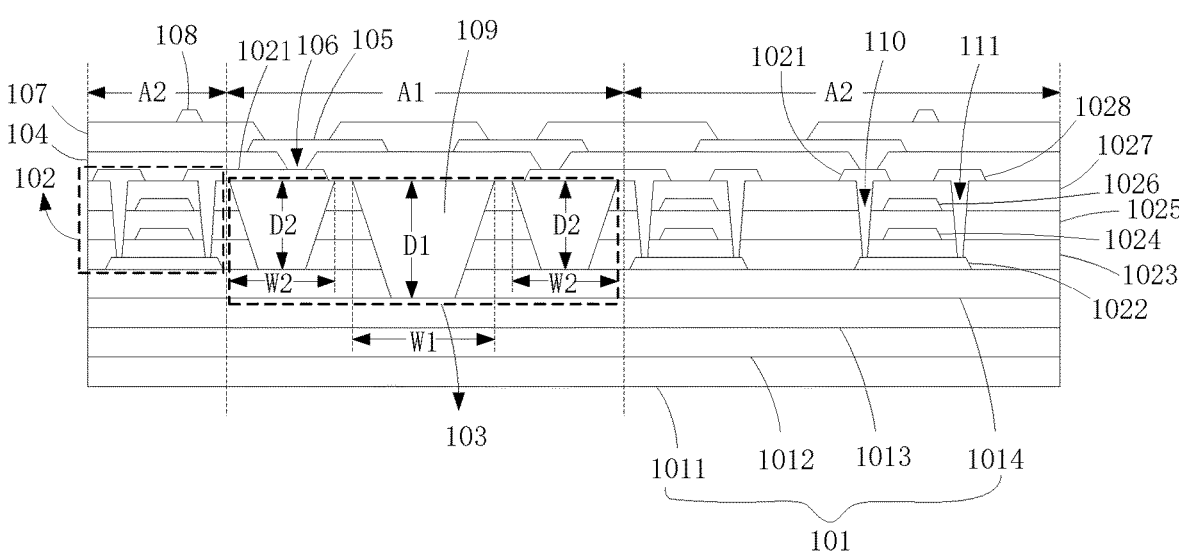
FIG. 1 is a schematic diagram of a basic structure of a display panel of an embodiment of the present disclosure.

FIG. 1 is a schematic diagram of a basic structure of a display panel of an embodiment of the present disclosure. The display panel is divided into a bending area A1 and a non-bending area A2. The display panel includes a substrate layer 101, a thin film transistor layer 102, an organic filling layer 103, a planarization layer 104, a pixel electrode 105, and a pixel definition layer 107. The thin film transistor layer 102 is disposed on the substrate layer 101 and corresponds to the non-bending area A2. The organic filling layer 103 is disposed on the substrate layer 101 and corresponds to the bending area A1. The planarization layer 104 is disposed on the thin film transistor layer 102 and the organic filling layer 103. The pixel electrode 105 is disposed on the planarization layer 104 and is connected to a source 1021 of the thin film transistor layer 102 through a first via hole 106. The pixel definition layer 107 is disposed on the planarization layer 104 and corresponds to a gap of the pixel electrode 105. The pixel electrode 105 in the bending area A1 is connected to the source 1021 of the thin film transistor layer 102 in the non-bending area A2 through a metal trace. The organic filling layer 103 includes a plurality of second via holes 109. The plurality of second via holes 109 are filled with an organic photoresist.

In one embodiment, the substrate layer 101 includes a first substrate layer 1011, a first buffer layer 1012 disposed on the first substrate layer 1011, a second substrate layer 1013 disposed on the first buffer layer 1012, and a second buffer layer 1014 disposed on the second substrate layer 1013.

In one embodiment, the thin film transistor layer 102 further includes an active layer 1022, a gate insulating layer 1023 disposed on the active layer 1022, a gate 1024 disposed on the gate insulating layer 1023, a second insulating layer 1025 disposed on the gate 1024, a second metal layer 1026 disposed on the second insulating layer 1025, a dielectric layer 1027 disposed on the second metal layer 1026, and a drain 1028 on the dielectric layer 1027. The source 1021 is connected to one end of the active layer 1022 through a third via hole 110, and a drain 1028 is connected to the other end of the active layer 1022 through a fourth via hole 111.

In one embodiment, the display panel further includes a spacer 108, and the spacer 108 is disposed on the pixel definition layer 107.

It should be noted that the display panel of an embodiment of the present disclosure includes at least one bending area A1. In the present disclosure, by disposing the thin film transistor layer 102 in the non-bending area A2, and not disposing the thin film transistor in the bending area A1, an electrical drift of the thin film transistor can be avoided when the thin film transistor is bent, thereby avoiding affecting display performance. Moreover, the pixel electrode 105 in the bending area A1 is connected to the source 1021 of the thin film transistor layer 102 in the non-bending area A2 through the metal trace. That is, the pixel electrode in the bending area A1 can be controlled by the thin film transistor in the non-bending area A2 such that the bending area A1 can also be displayed normally without affecting a resolution of the display panel. Also, in the present disclosure, the plurality of second via holes 109 are disposed under the metal trace and filled with the organic photoresist, so as to reduce a risk of the metal trace breaking due to a bending process and release the stress on each the film layer during bending. The present disclosure only changes the pixel structure in the bending area A1, so a scope of influence is minor, and it will not affect a reliability of the non-bending area A2.

In one embodiment, the metal trace connecting the pixel electrode 105 in the bending area A1 and the thin film transistor layer 102 in the non-bending area A2 can be the source 1021 (as shown in FIG. 1). Alternatively, it can be replaced by other wire that is more resistant to bending. In this embodiment, the pixel electrode 105 in the bending area A1 and the thin film transistor layer 102 in the non-bending area A2 are connected through the source 1021, and this structure can avoid a display failure caused by a broken scan line. Material of the source trace has strong bending resistance, and a risk of breaking due to the bending process is small. Moreover, the plurality of second via holes 109 are disposed under the source 1021 and filled with the organic photoresist, which can greatly relieve the stress on each film layer during bending.

It should be noted that, in the display panel of an embodiment of the present disclosure, a portion corresponding to the bending area A1 can be bent from an inside to an outside, or from the outside to the inside. A bending radius ranges from 0 to 20 mm.

It should be noted that the plurality of second via holes 109 are formed by etching, and a width of an etching area may be greater than a width of the bending area A1, that is, greater than πR, so as to better release the stress generated during bending. R refers to the bending radius of the display panel. The plurality of second via holes 109 are formed by being subjected to at least once dry etching. In some embodiments, the plurality of second via holes 109 can also be filled with other organic substances with strong bending resistance.

In one embodiment, cross-sectional widths of the second via holes 109 are the same (not shown in the drawings). Alternatively, the cross-sectional widths of the second via holes 109 gradually decrease from a center of the bending area A1 to both sides (as shown in FIG. 1, W1>W2). The bending area A1 of the present disclosure is done by forming via holes and filling them, and the widths of the second via holes 109 are predetermined. The widths of the second via holes 109 are adjusted according to the stress on the bending area A1, which greatly relieves the stress on each film layer during bending and reduces the risk of metal trace breaking.

In one embodiment, depths of the second via holes 109 range from greater than 0 to less than or equal to 20 microns. The depths of the second via holes 109 can be the same (not shown in the drawings). Alternatively, the depths of the second via holes 109 gradually decrease from the center of the bending area A1 to both sides (as shown in FIG. 1, D1>D2). In this embodiment, the depths of the second via holes 109 are determined, and the depths of the second via holes 109 are adjusted according to the stress on each film layer during bending and reduces the risk of metal trace breaking.

Figure 2A:
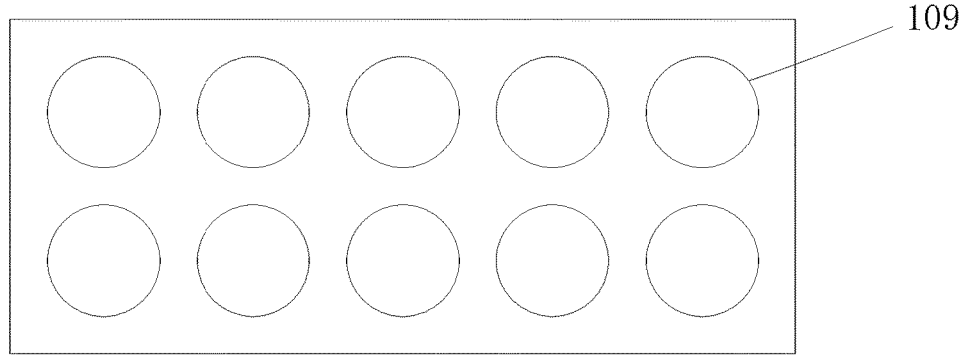
FIG. 2a to FIG. 2e are cross-sectional views of second via holes corresponding to a bending area of embodiments of the present disclosure.
Figure 2B:
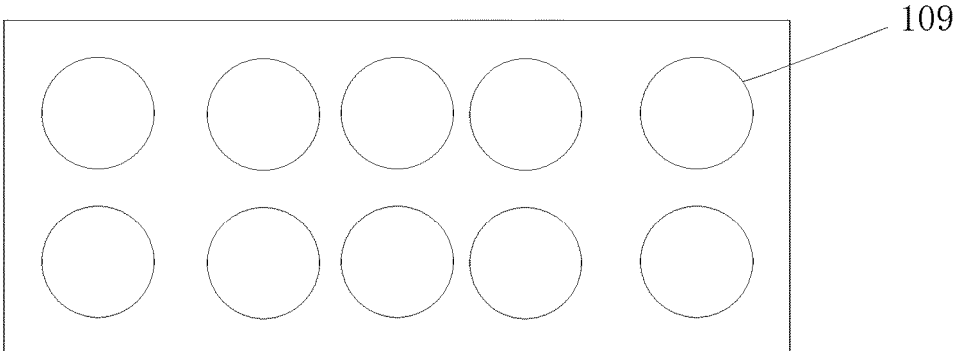

FIG. 2a to FIG. 2e are cross-sectional views of second via holes corresponding to a bending area of embodiments of the present disclosure. The second via holes 109 can be equally spaced apart from one another (as shown in FIG. 2a). Alternatively, distribution densities of the second via holes 109 gradually decrease from the center of the bending area to both sides (as shown in FIG. 2b). In these embodiments, distances between the second via holes 109 are predetermined. The distances between the second via holes 109 are adjusted according to the stress on the bending area A1, which greatly relieves the stress on each film layer during bending and reduces the risk of metal trace breaking.

Figure 2C:
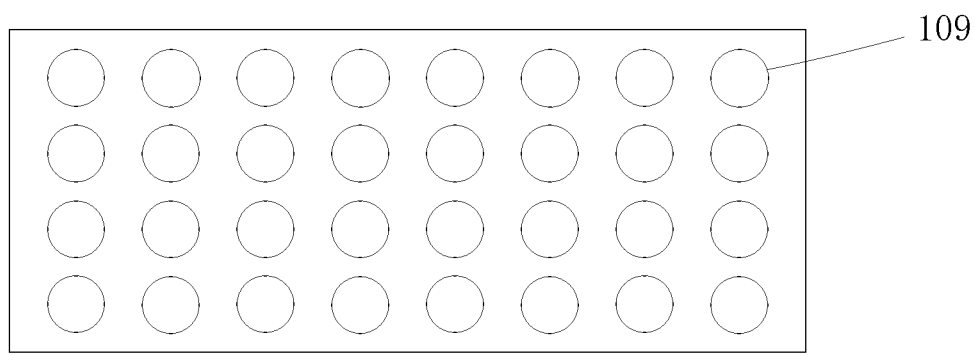

In one embodiment, under a premise that a size of the bending area remains unchanged, the number of the second via holes 109 may be increased. As shown in FIG. 2c, the number of the second via holes 109 is predetermined. The number of the second via holes 109 is adjusted according to the stress on the bending area A1, which greatly relieves the stress on each film layer during bending and reduces the risk of metal trace breaking.

Figure 2D:
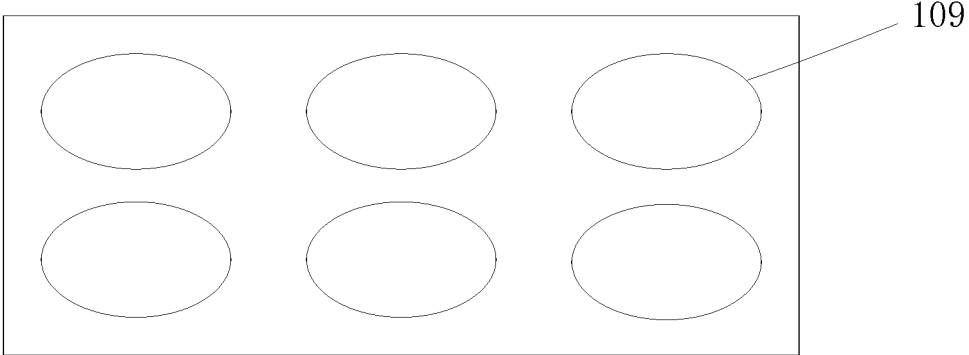
Figure 2E:
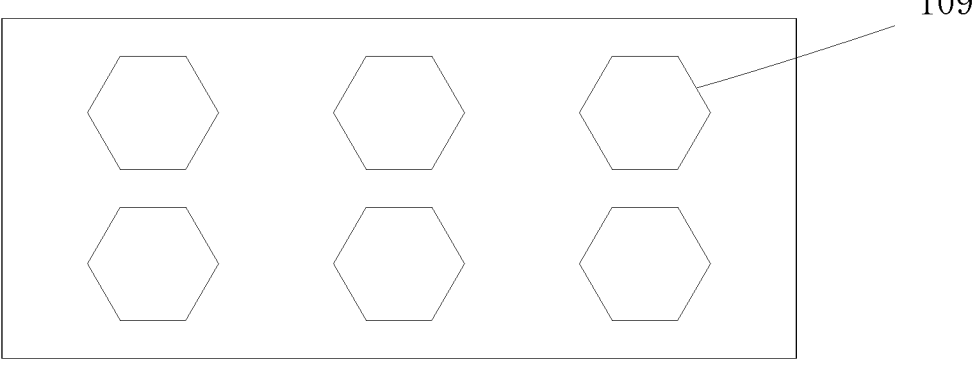

In one embodiment, shapes of the second via holes 109 are selected from a group consisting of a circle (as shown in FIG. 2a to FIG. 2c), an ellipse (as shown in FIG. 2d), a sector (not shown in the drawings), and a polygon (i.e., a hexagon as shown in FIG. 2e). In this embodiment, the shapes of the second via holes 109 are predetermined. The shapes of the second via holes 109 are adjusted according to the stress on the bending area A1, which greatly relieves the stress on each film layer during bending and reduces the risk of metal trace breaking.

FIG. 3 is a flowchart of a manufacturing method of a display panel of an embodiment of the present disclosure. The display panel is divided into a bending area and a non-bending area, and the manufacturing method includes the following steps.

In a step S301, a substrate layer is provided.

In a step S302, a thin film transistor layer is formed on the substrate layer and corresponds to the non-bending area.

In a step S303, a plurality of second via holes are formed on the substrate layer and corresponds to the bending area.

In a step S304, an organic photoresist is filled in the plurality of second via holes to form an organic filling layer.

In a step S305, a planarization layer is formed on the thin film transistor layer and the organic filling layer.

In a step S306, a pixel electrode is formed on the planarization layer. The pixel electrode is connected to a source of the thin film transistor layer through a first via hole, and the pixel electrode in the bending area is connected to the source of the thin film transistor layer in the non-bending area through a metal trace.

In a step S306, a pixel definition layer is formed on the planarization layer and corresponds to a gap of the pixel electrode.

It should be noted that the step S301 specifically includes the following. A first substrate layer is coated on a glass substrate. A first buffer layer is deposited on the first substrate layer. A second substrate layer is coated on the first buffer layer to form a double polyimide (PI) structure. A second buffer layer is deposited on the second substrate layer.

It should be noted that the step S302 specifically includes the following. An active layer is formed on the second buffer layer. The active layer is crystallized and patterned to form a TFT channel and a trace. A gate insulating layer and a first metal layer are deposited on the active layer. The first metal layer is patterned to form a gate and a scan line. A second insulating layer and a second metal layer are deposited on the gate. The second metal layer is patterned to form a second electrode of a storage capacitor and a discharge line.

A dielectric layer is deposited on the second metal layer. A source and a drain are formed on the dielectric layer. The source is connected to one end of the active layer through a third via hole. The drain is connected to the other end of the active layer through a fourth via hole.

It should be noted that the, in the present disclosure, by disposing the thin film transistor layer in the non-bending area, and not disposing the thin film transistor in the bending area, an electrical drift of the thin film transistor can be avoided when it is bent, thereby avoiding affecting display performance. Moreover, the pixel electrode in the bending area is connected to the source of the thin film transistor layer in the non-bending area through the metal trace. That is, the pixel electrode in the bending area can be controlled by the thin film transistor in the non-bending area such that the bending area can also be displayed normally without affecting a resolution of the display panel. Also, in the present disclosure, the plurality of second via holes are disposed under the metal trace and filled with the organic photoresist, so as to reduce a risk of the metal trace breaking due to a bending process and release the stress on each the film layer during bending.

It should be noted that in the step S303, the plurality of second via holes may be spaced equally apart from one another. Alternatively, distribution densities of the plurality of second via holes gradually decrease from a center of the bending area to both sides. Their cross-sectional widths may be the same. Alternatively, the cross-sectional widths gradually decrease from the center of the bending area to both sides. Their depths range from greater than 0 to less than or equal to 20 microns. Their depths may be the same. Alternatively, the depths gradually decrease from the center of the bending area to both sides. Their shapes are selected from a group consisting of a circle, an ellipse, a sector, and a polygon. In the embodiments of the present disclosure, a size and depth of the holes in the bending area are gradually changed. Densities and depths of the holes are adjusted according to the stress of the bending area, which greatly relieves the stress on each film layer during bending, and reduces the risk of metal trace breaking.

It should be noted that the manufacturing method also includes forming a spacer on the pixel definition layer.

An embodiment of the present disclosure also provides a display device, including a driver chip and the above-mentioned display panel. The display device of the embodiment of the present disclosure may be any product or component with a display function, such as a mobile phone, a tablet, a TV, a monitor, a notebook, a digital camera, a navigator, and so on.

In summary, in the display panel of the embodiments of the present disclosure, by disposing a thin film transistor in the non-bending area, the pixel electrode in the bending area is connected to the thin film transistor in the non-bending area through the metal trace. This can prevent a scan line from breaking due to a bending process, and the electrical properties of the thin film transistor will not be greatly shifted during bending. Moreover, the plurality of via holes are disposed under the metal trace in the bending area and filled with the organic photoresist, which can reduce the risk of the metal trace breaking and greatly relieve the stress on each the film layer when it is bent. Accordingly, it solves the technical problems in the prior art, such as a bendable display panel cannot achieve high resolution, a process is complicated, a manufacturing process is difficult, and electrical properties of a thin film transistor will drift with a bending process, thereby affecting display performance.

It should be understood that, to a person skilled in the art, equivalent substitution or modification may be made according to the technical solutions and invention concept of the present disclosure, and all these modifications or substitutions shall be encompassed in the scope of the claims of the present disclosure.

What is claimed is:

1. A display panel, wherein the display panel is divided into a bending area and a non-bending area, and comprises:
   a substrate layer;
   a thin film transistor layer disposed on the substrate layer and corresponding to the non-bending area;
   an organic filling layer disposed on the substrate layer and corresponding to the bending area;
   a planarization layer disposed on the thin film transistor layer and the organic filling layer;
   a pixel electrode disposed on the planarization layer and connected to a source of the thin film transistor layer through a first via hole; and
   a pixel definition layer disposed on the planarization layer and corresponding to a gap of the pixel electrode,
   wherein the pixel electrode in the bending area is connected to the source of the thin film transistor layer in the non-bending area through a metal trace, the organic filling layer comprises a plurality of second via holes, and an organic photoresist is filled in the plurality of second via holes,
   wherein cross-sectional widths of the second via holes gradually decrease from a center of the bending area to both sides of the bending area.

2. The display panel as claimed in claim 1, wherein the second via holes are spaced equally apart from one another.

3. The display panel as claimed in claim 1, wherein distribution densities of the second via holes gradually decrease from a center of the bending area to both sides.

4. The display panel as claimed in claim 1, wherein depths of the second via holes range from greater than 0 to less than or equal to 20 microns.

5. The display panel as claimed in claim 4, wherein the depths of the second via holes are the same.

6. The display panel as claimed in claim 4, wherein the depths of the second via holes gradually decrease from a center of the bending area to both sides.

7. The display panel as claimed in claim 1, wherein shapes of the second via holes are selected from a group consisting of a circle, an ellipse, a sector, and a polygon.

8. A display device, comprising a driver chip and a display panel, wherein the display panel is divided into a bending area and a non-bending area, and comprises:
   a substrate layer;
   a thin film transistor layer disposed on the substrate layer and corresponding to the non-bending area;
   an organic filling layer disposed on the substrate layer and corresponding to the bending area;
   a planarization layer disposed on the thin film transistor layer and the organic filling layer;
   a pixel electrode disposed on the planarization layer and connected to a source of the thin film transistor layer through a first via hole; and
   a pixel definition layer disposed on the planarization layer and corresponding to a gap of the pixel electrode,
   wherein the pixel electrode in the bending area is connected to the source of the thin film transistor layer in the non-bending area through a metal trace, the organic filling layer comprises a plurality of second via holes, and an organic photoresist is filled in the plurality of second via holes, wherein cross-sectional widths of the second via holes gradually decrease from a center of the bending area to both sides of the bending area.

9. The display device as claimed in claim 8, wherein the second via holes are spaced equally apart from one another.

10. The display device as claimed in claim 8, wherein distribution densities of the second via holes gradually decrease from a center of the bending area to both sides.

11. The display device as claimed in claim 8, wherein depths of the second via holes are the same.

12. The display device as claimed in claim 8, wherein depths of the second via holes gradually decrease from a center of the bending area to both sides.

* * * * *